(12) United States Patent
Acacio

(10) Patent No.: US 6,855,005 B2
(45) Date of Patent: Feb. 15, 2005

(54) DOUBLE FLUKE SECURITY SEALING RING FOR WATT-HOUR METERS

(75) Inventor: Victor Franco Acacio, Mexico City (MX)

(73) Assignee: IUSA-Ge, S. de R.L. de C.V., Mexico City (MX)

( * ) Notice: Subject to any disclaimer, the term of this patent is extended or adjusted under 35 U.S.C. 154(b) by 241 days.

(21) Appl. No.: 10/035,610

(22) Filed: Nov. 9, 2001

(65) Prior Publication Data

US 2002/0135355 A1 Sep. 26, 2002

(30) Foreign Application Priority Data

Mar. 28, 2001 (MX) .............................. PA/a/2001/003204

(51) Int. Cl.[7] .............................................. H01R 33/945
(52) U.S. Cl. ..................................... 439/517; 361/659
(58) Field of Search ................................ 439/517, 508; 361/659, 664, 665, 666, 667

(56) References Cited

U.S. PATENT DOCUMENTS

| 4,008,585 A | 2/1977 | Lundberg |
| 4,076,291 A | 2/1978 | Pope et al. |
| 4,134,609 A | 1/1979 | Santoni |
| 4,149,741 A | 4/1979 | Lipscomb et al. |
| 4,493,230 A | 1/1985 | Hughes |
| 4,531,770 A | 7/1985 | Mattress, Jr. |
| 4,934,747 A | 6/1990 | Langdon et al. |
| 5,048,881 A | 9/1991 | Renfro |
| 5,207,595 A | 5/1993 | Learmont et al. |
| 5,704,804 A | 1/1998 | Robinson et al. |
| 5,851,038 A | 12/1998 | Robinson et al. |
| 5,871,243 A | * 2/1999 | Wenk .......................... 292/320 |
| 5,944,555 A | 8/1999 | Robinson et al. |

* cited by examiner

Primary Examiner—Khiem Nguyen
(74) Attorney, Agent, or Firm—Honigman Miller Schwartz and Cohn LLP

(57) ABSTRACT

A double fluke security sealing ring for use in polyphase and single phase watt-hour meter includes a series of elements such as, a ring-type circular band made of stainless steel that has, at one end, annular rims folded at 90° along itself and two slotted flanges also folded at 90° forming the double fluke, and at the other end, two parallel and equidistant slots. It is not possible to revert the hooking action and effect once the sealing wire is installed due to the reduced internal space within the two flange slots. Therefore, the security sealing ring is red-flagged when the security sealing ring has been violated with the intention of manually moving the record pointers in order to alter the meter consumption lecture.

6 Claims, 8 Drawing Sheets

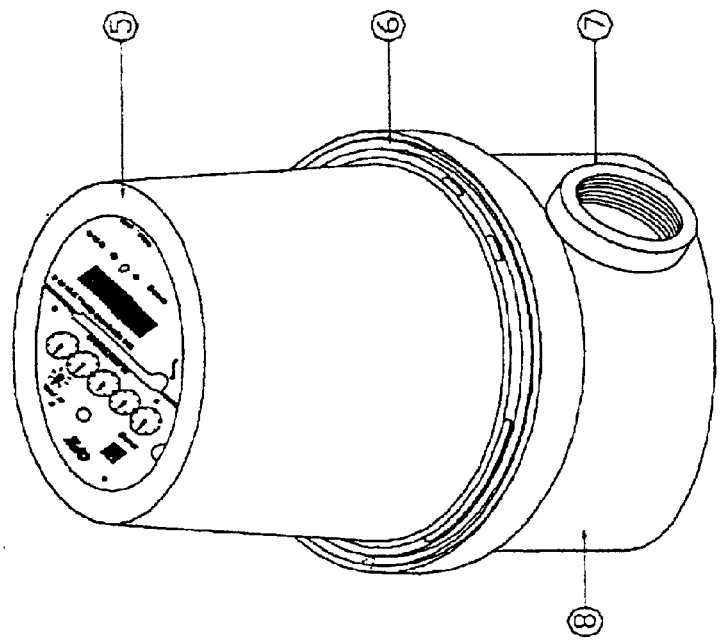
FIG. #1
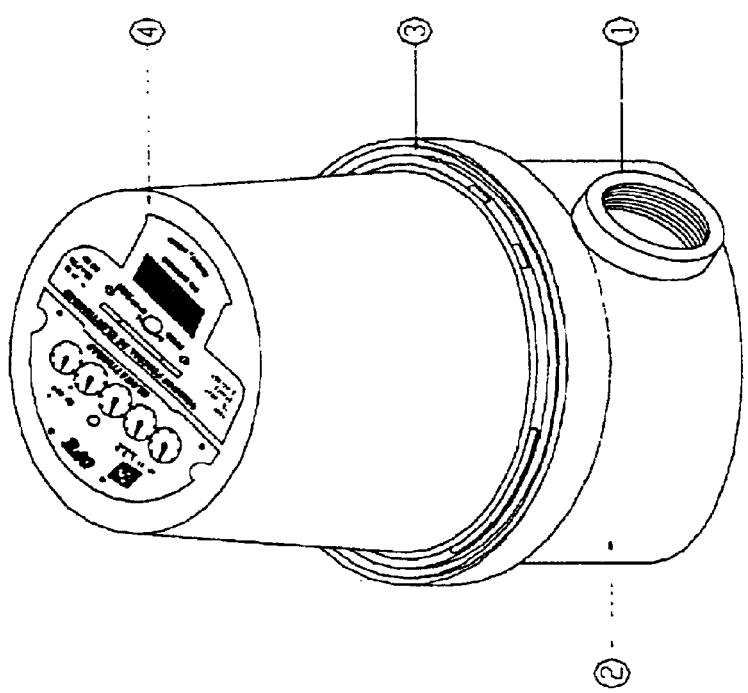
FIG. #2

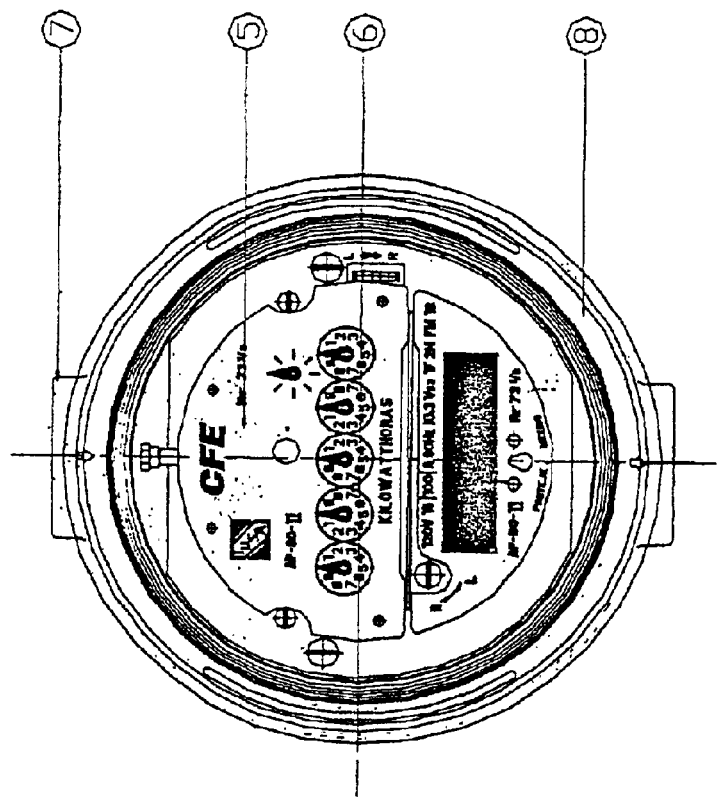
FIG. #4
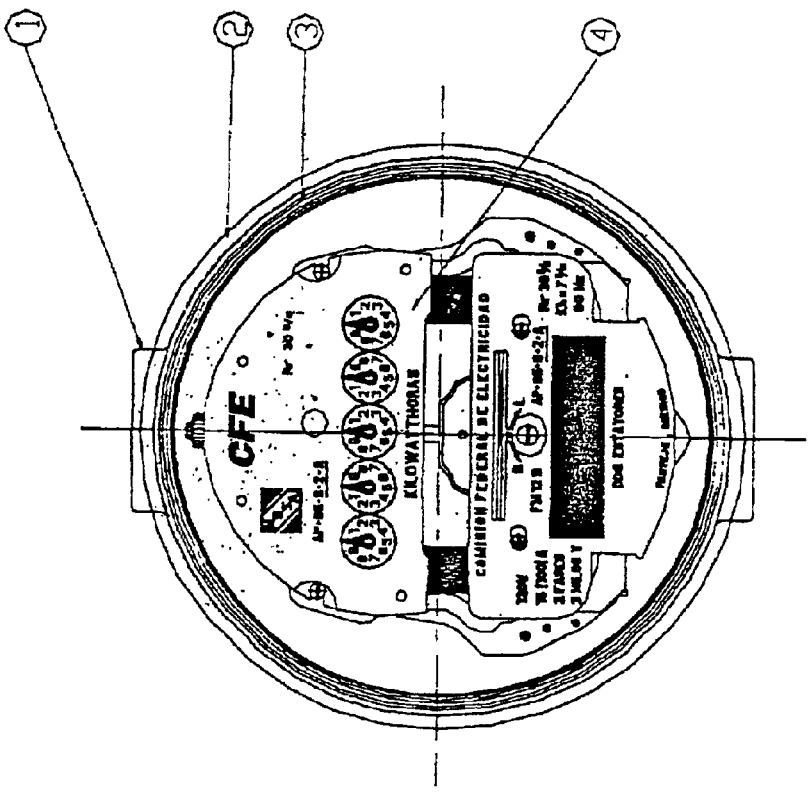
FIG. #3

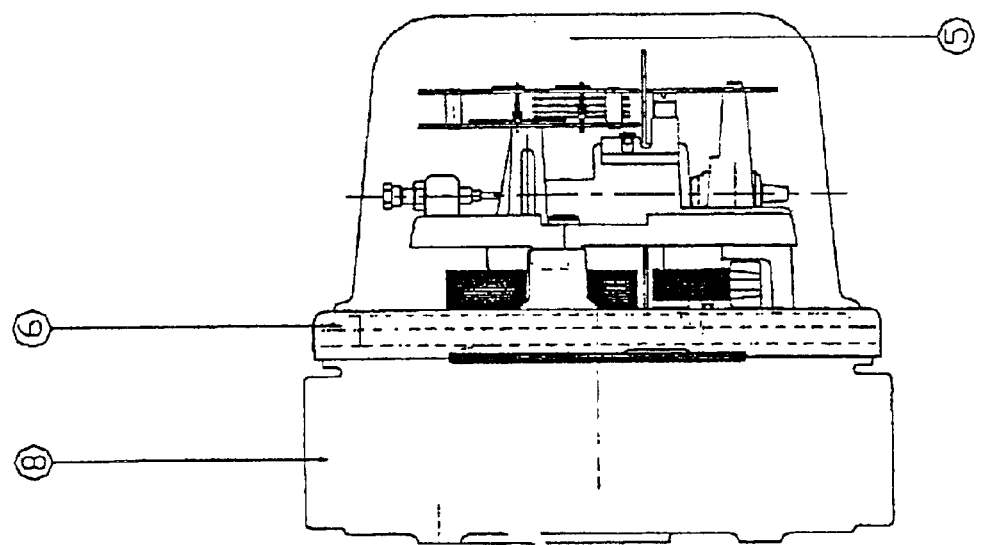
FIG. #6
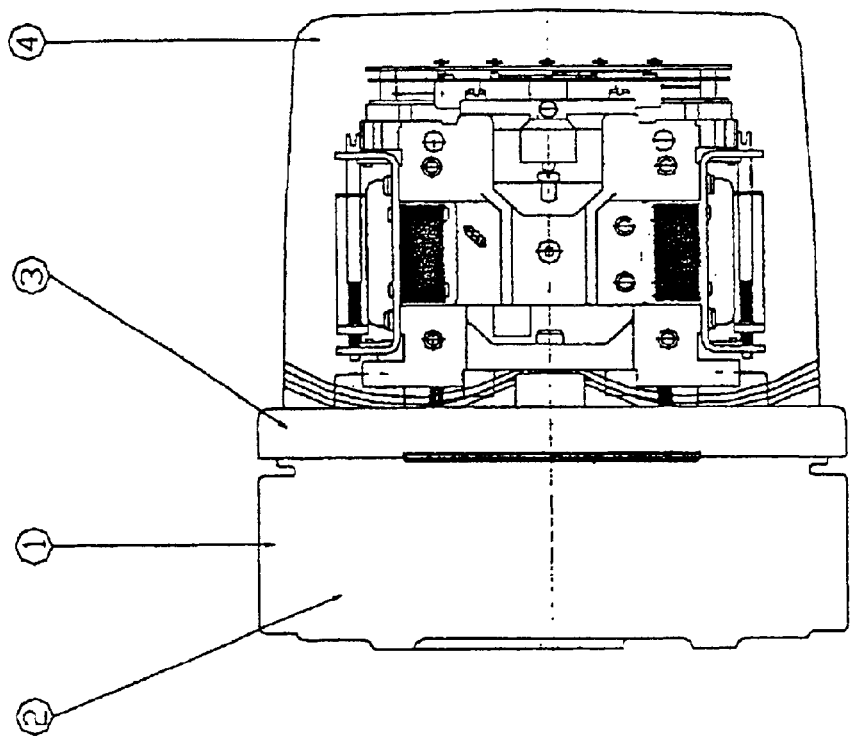
FIG. #5

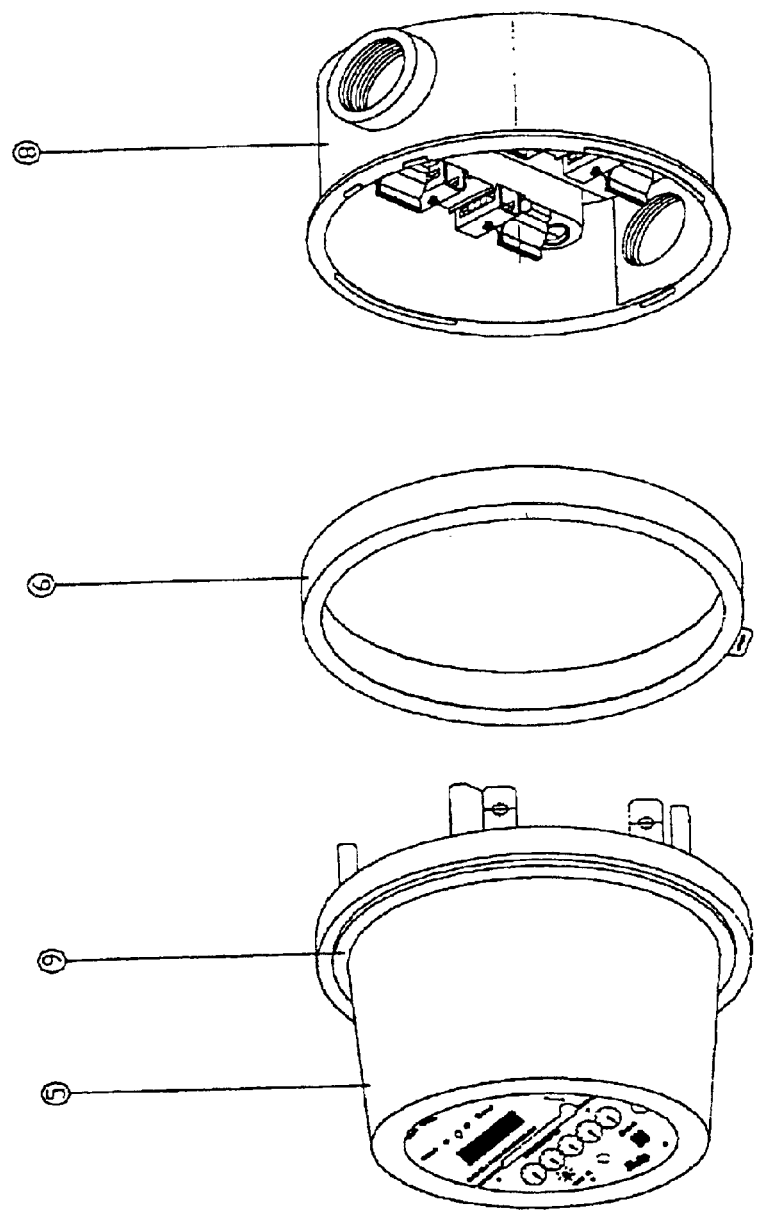

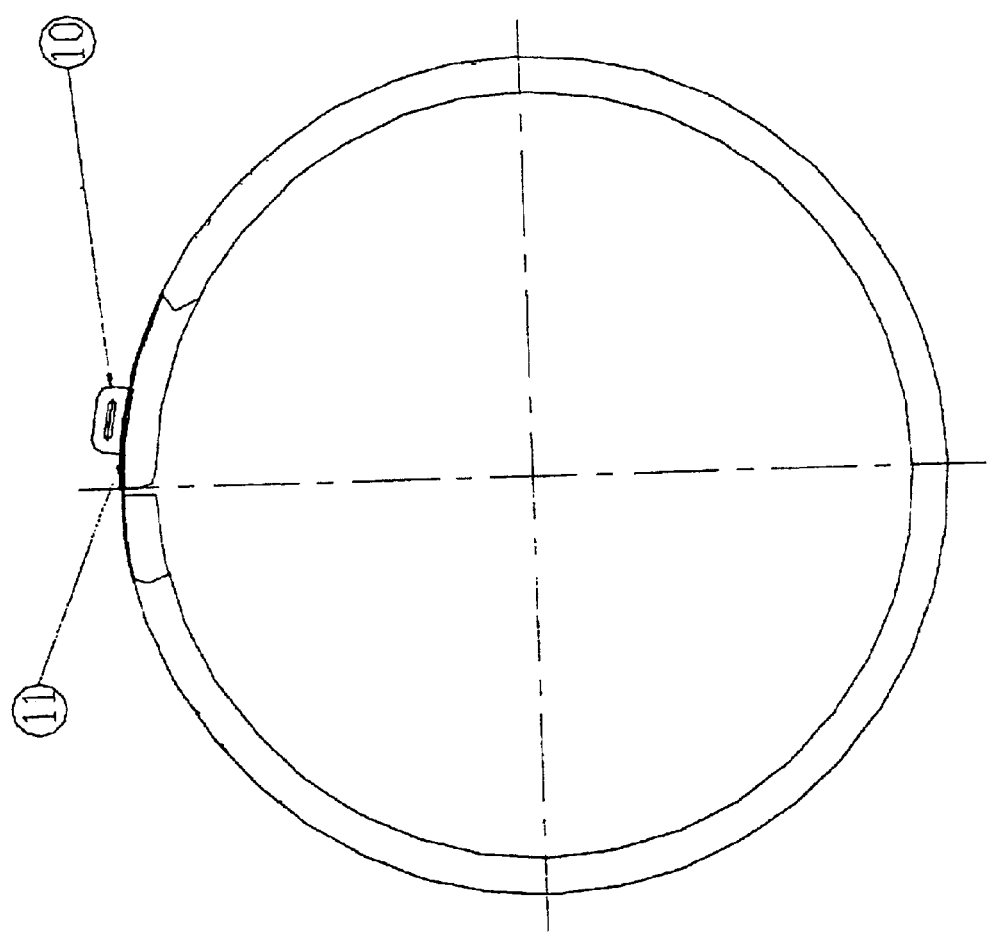
FIG. #8

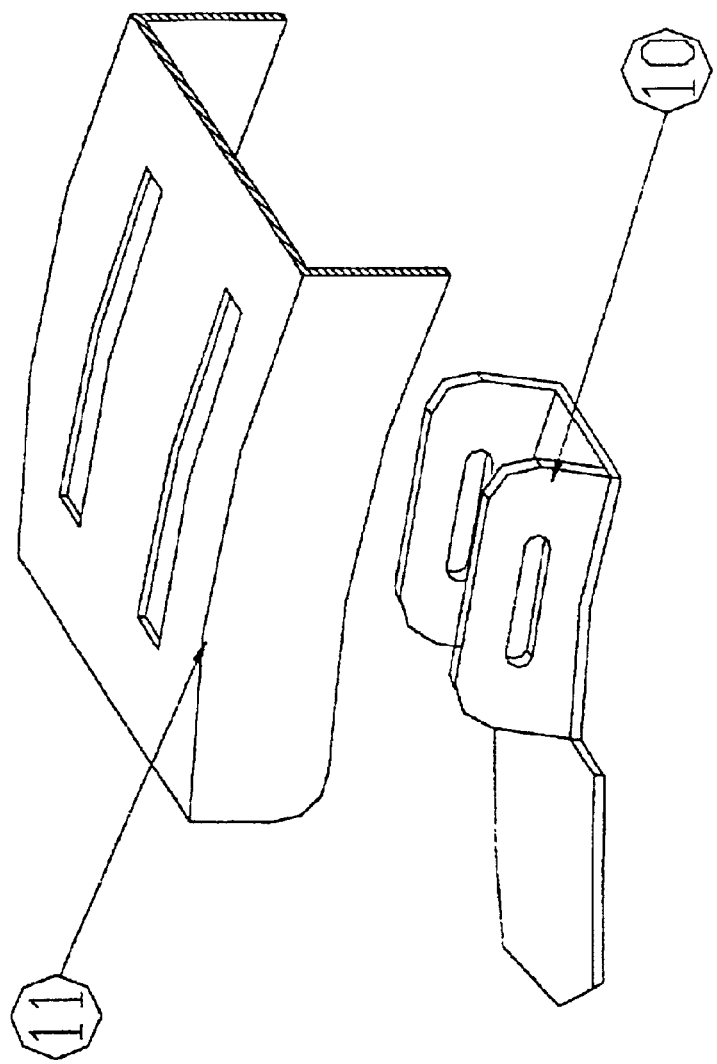
FIG. #9

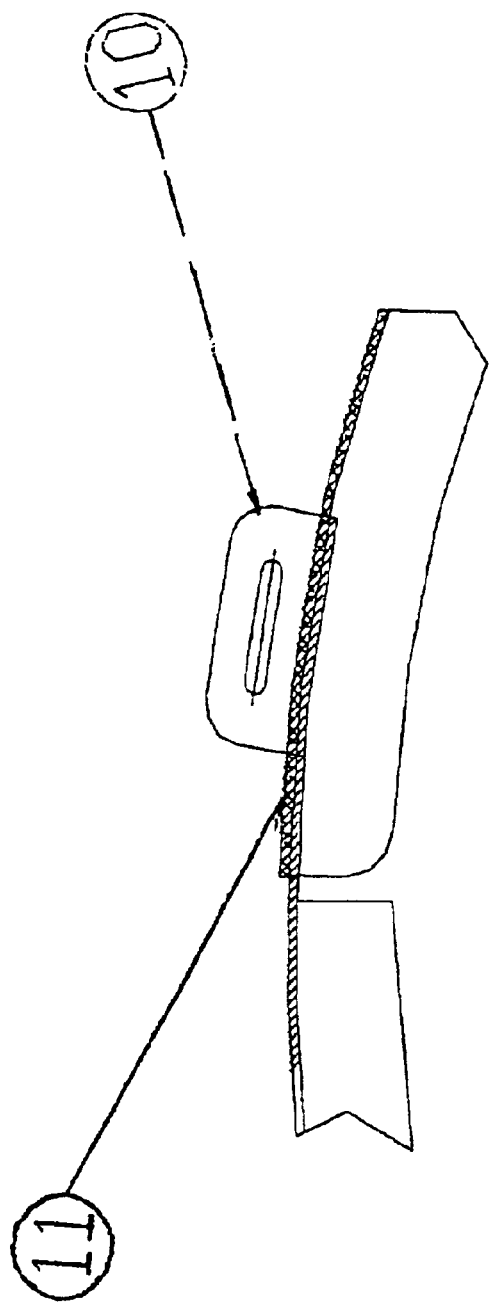
FIG. #10

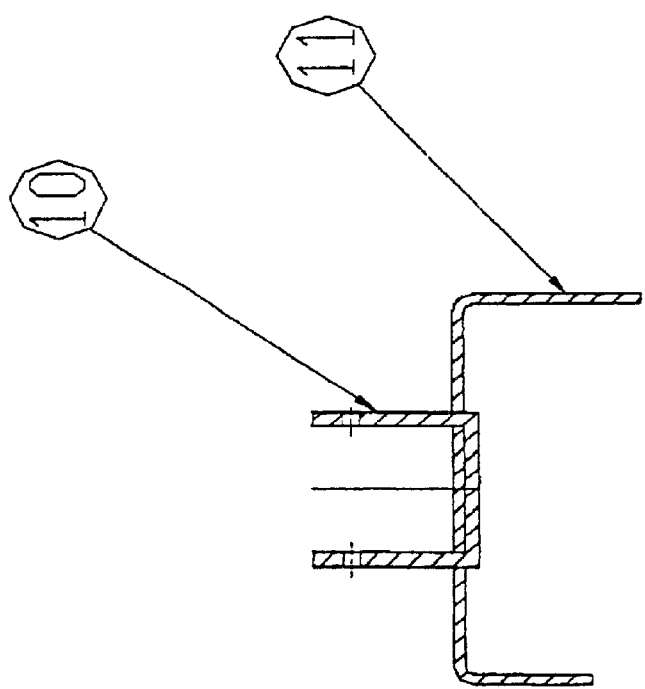
FIG. #11

DOUBLE FLUKE SECURITY SEALING RING FOR WATT-HOUR METERS

FIELD OF THE INVENTION

The present invention relates in general to the electric utility industry using watt-hour meter equipment to measure electric power consumption at residential, commercial and industrial premises so that the electric power supplier company entrusted to offer this service may, subsequently, issue a service charge receipt per amount of consumed electric power, and in particular to watt-hour meters that use security sealing rings, belts or straps.

BACKGROUND OF THE INVENTION

The electric utility industry employs socket-type watt-hour meters to measure electric power consumption, commonly mounted on a wall of residential, commercial and industrial buildings. These type of watt-hour meters contain terminals which are connected to the electric line or to electric load conductors. The terminals are also connected to internal conductors within the socket, which extend to jaw contacts positioned to receive the blade terminals of a plug-on watt-hour meter to complete an electric circuit through the watt-hour meter between the line and load terminals and the conductors.

The socket-type watt-hour meter has a ring-type cover, which includes some annular mounting flanges projecting outwardly from an opening through which the blade terminals of the watt-hour meter extend. Both mounting flanges are maintained together by means of the meter ring and the base housing. Once assembled they are encircled by the security sealing ring, thereby sealing the single-phase or polyphase watt-hour meter to the base.

A common type of belt seal for socket-type watthour meter usually includes a lock that slips into a fluke, which extends outwardly at one end of the belt, and slipping the fluke through a slot formed in the other end of the belt or sealing ring.

Another common type of lock belt seal consists on a bolt passing through flukes, which are bent downwards, and are located at each end of the security belt.

Another type of belt seal consists on a fluke formed by a first end of an angular strap including a plurality of linearly spaced openings, and a cover secured to the other end of the strap, and including a passage through which the fluke extends retractable. The belt has a fastener or screw mounted in the cover in order to mate with the spaced apertures in the fluke. The fluke moves forward and backward at the first end of the strap or another fluke moves forward and backward at the second end of the strap. Both flukes are separated from the second end of the strap and within the openings of the straps. The sealing action is obtained by means of sealing wires or plastic padlocks inserted through the openings of each fluke in order to indicate when the sealing mechanism in the belt seal has been tampered.

The wires used to join the flukes are tied together by means of a lead piece, not with the intention of securing the system, but to indicate that the system has not been opened, and whether the padlock has not been manipulated in anyway. This system has the inconvenience of requiring a key in order to be opened, which the authorized serviceman of the electric power supplier company may not be carrying, may have lost, or the padlock may be damaged by the failed attempts of some user when trying to open it. Thus, when finding such inconveniences, the maintenance task is not performed with an adequate periodicity, and this lack of maintenance may cause failures in the watt-hour meter lecture system, or the electric power supplier company may have to incur in additional expenses when having to constantly change the padlocks.

Another type of sealing ring, belt or strap seal consists on an open ring bearing at one end, and a fluke with a series of horizontal notches on both sides thereof. The fluke is inserted on the other end of the ring inside a ladle, which has side shoulders in order to facilitate the notches obstruction to prevent the fluke from retracting.

Another type of sealing ring, belt or strap seal consists on two substantially identical "U" shaped covers each one placed on each end of the annular strap. In the strap there are some openings or slots located at the lateral walls of each cover. There is an additional slot on each cover, receiving an insert having an opening centrally formed therein. A beaded screw is mounted on the insert of one of the covers, and the opposite end of it passes through the other cover insert at the opposite end of the fastener and is hooked to the insert opening of the other cover. The end of the fastener opposite to the head of the screw has an elongated slot, which is aligned by rotation to the openings in the sidewalls in order to receive a sealing wire or a plastic padlock after the ring has been mounted to attach the watt-hour meter and the meter socket cover. The mechanism has the inconveniences that it may be damaged by failed attempts of some user when trying to open it or the damage in the mechanism may prevent an authorized serviceman from opening the mechanism in order to carry out the periodical maintenance. The impossibility of carrying out the maintenance may cause failures in the lecture system of the watt-hour meter, or incurring on additional expenses when having to constantly change the security mechanisms.

Several examples of the state of the art related to security sealing ring, belts or straps have been published on different U.S. patents, such as U.S. Pat. Nos. 4,008,585; 4,076,291; 4,134,609; 4,149,741; 4,493,230; 4,531,770; 4,934,747; 5,048,881; 5,207,595; 5,704,804; 5,851,038 and 5,944,555. All these security sealing rings, belts and straps present one or more disadvantages, where the following stands out: poor flexibility not being able to be used more than once, complex mechanism, complex installation, high production costs, need of specialized means (keys, padlocks, sophisticated tools, etc.) in order to remove the security sealing rings, belts and straps. It is necessary to point out that the above-mentioned U.S. patents do not affect the novelty nor the inventive step, as for the security lock mechanisms from the present invention are totally different from the ones in the above-mentioned U.S. patents.

It is important to mention that on May 18, 1999, the same inventor of this invention filed Mexican Patent Application No. 994595 entitled "Single use security sealing ring for watt-hour meters". The single use sealing ring presents an irreversible hooking system; that is to say, once the sealing wire is destroyed, the system cannot be used again, which makes it disposable. In contrast, the sealing ring of the present invention can be opened once the sealing wire is cut by the maintenance serviceman from the electric power supplier company and can continue or extend its use by installing a new sealing wire. Furthermore, the single use sealing ring presents a much higher production cost because the materials making up the single use sealing ring are structurally robust, while the double fluke sealing ring of the present invention requires materials with less thickness for its production. In conclusion, the double fluke sealing ring presents superior characteristics than those offered in the single use sealing ring by being more versatile in its functionality and structurally more simple.

An object of the present invention is to solve problems associated with the use of mechanisms currently offered in the security sealing rings or straps that are constructed with very complex mechanisms withhigh replacement costs to the electric power supplier company, either due to the replacement of the security sealing ring mechanism or due to the replacement of the watt-hour meterthat may break when tampered with.

One object of the present invention is to provide a security sealing ring which offers advantages, such as easy installation due to the simplicity of the mechanism, easy detection of a violated or altered security sealing ring, tamper resistance, multiple use with the purpose of facilitating and diminishing the maintenance service costs, and a reduced price compared to the security sealing rings currently offered in the market.

SUMMARY OF THE INVENTION

This invention particularly relates to security sealing rings or straps universally used in single-phase and polyphase watt-hour meters with the object of avoiding removal of the components making up the same, as well as avoiding alterations in the watt-hour meters by the user, with the purpose of evading or preventing the utility company serviceman from taking real lectures of electric power consumption to be reported to the electric power supplier company.

The present invention comprises a security sealing ring for watt-hour meters, consisting of a sealing ring made of resistant material, preferably stainless steel type 430, with security rims rolled along the sealing ring body on both sides. The security sealing ring meets the ANSI (American National Standard Industry) construction standards for residential, commercial and industrial watt-hour meters, which establishes the minimum and maximum dimensions of the permitted circumference.

The security sealing ring for watt-hour meters of the present invention comprises a circumference-shaped security sealing ring with a locking mechanism at each of its ends.

One preferred embodiment of the invention is a locking mechanism comprising at one end, two flanges projecting at 90° and forming a double fluke. Each flange has a central slot horizontally formed, both slots being positioned face to face. The other end of the security sealing ring has two parallel and equidistant slots; so that the two flanges of the fluke can respectively get through the slots upon assembling the watt-hour meter and the socket-type base. In this way, both the watt-hour meter and the base remain firmly attached and, later on, a lead or plastic sealing wire is introduced through the slots in the two flanges of the fluke, thereby identifying the security sealing ring once it is closed as a tamper-resistant security sealing ring.

Once the security sealing ring for watt-hour meters is placed and closed through the hooking action and effect produced by the interaction between the two flanges of the double fluke, located at one end of the security sealing ring, and the slots on the other end of the device of present invention, and once the sealing wire has been placed, it is not possible to revert the hooking action and effect of the double security fluke. Because the wire diameter is practically of the same size of the flange slots, it is not possible to maneuver the sealing wire, thereby avoiding the removal of the ring and of the glass cover to alter the watt-hour meter record.

Once the security sealing ring is placed in the watt-hour meter, it provides a greater security in watt-hour residential, commerce and industrial areas, where a big number of illegal manipulations are performed because the mechanism has the sealing wire, which performs the hooking action and effect through the security flanges of the double fluke, a "tamper-resistant" lock is obtained, under normal conditions of use. The only way to open or release said tamper-resistant locking mechanism is by cutting the sealing wire. The present invention offers the advantage that the serviceman from the electric power supplier company may cut the sealing wire, unhook or open the double fluke sealing ring and fulfill the necessary maintenance service on the watt-hour meter, attach the same security sealing ring and install another sealing wire. Furthermore, the advantages of the double fluke security sealing ring above mentioned, as those skilled in the art can appreciate, are the following: during maintenance services the serviceman from the electric power supplier companies are not bound to carry keys, padlocks, sophisticated tools, etc.; easy detection of a violated double fluke security sealing ring and prompt solution; easy to install due to the simplicity of the mechanism; great functionality; low production cost, and the like.

BRIEF DESCRIPTION OF THE DRAWINGS

FIG. 1 shows a perspective view of the polyphase watt-hour meter that uses the security sealing ring of the present invention.

FIG. 2 shows a perspective view of the single-phase watt-hour meter that uses the security sealing ring of the present invention.

FIG. 3 is a top front view of the polyphase watt-hour meter that uses the security sealing ring of the present invention.

FIG. 4 is a top front view of the single-phase watt-hour meter that uses the security sealing ring of the present invention.

FIG. 5 is a top side view of the polyphase watt-hour meter that uses the security sealing ring of the present invention.

FIG. 6 is a top side view of the single-phase watt-hour meter that uses the security sealing ring of the present invention.

FIG. 7 is an isometric projection of a conventional single-phase watt-hour meter to measure electric power that uses the security sealing ring of the present invention.

FIG. 8 is a side view of the parts making up the security sealing ring for watt-hour meters.

FIG. 9 is a detailed view of the security sealing ring locking mechanism in its opened form.

FIG. 10 is a detailed view of the security sealing ring locking mechanism of the present invention.

FIG. 11 is a sectioned view of FIG. 10 showing the details of the hooking action of the two ends of the security sealing ring of the present invention.

DETAILED DESCRIPTION OF THE INVENTION

With regard to the present invention, its use has been illustrated in the drawings of FIGS. 1 to 7 and in the drawings of FIGS. 8 to 11, as the parts making up the same. A security sealing ring (3) to be used in the watt-hour meters (FIGS. 1, 3 and 5) has been mentioned to indistinctly be applied in polyphase and single phase watt-hour meters (FIGS. 2, 4, 6 and 7), wherein a complete socket type housing of a conventional polyphase and single phase watt-hour meter is shown containing, as one part, a polyphase meter 4 in FIGS. 1, 3 and 5, and a single phase watt-hour meter 5 in FIGS. 2, 4, 6 and 7, integrated to the socket type housing base 2 in FIGS. 1, 3 and 5; and a base 8 in FIGS. 2, 4, 6 and 7. Both watt-hour meters 4, 5 show a double fluke security sealing ring 3, 6 from a perspective view of the polyphase meter in FIG. 1, from a top frontal view in FIG. 3, and from a top side view in FIG. 5; and correspondingly for the single phase meter in FIGS. 2, 4, 6 and 7, in the same position. In FIG. 7, an isometric projection of the security sealing ring 6 to be used in a conventional single-phase 5 watt-hour meter is shown.

Placement of the security sealing rings 3 and 6 is made in the base of the polyphase meter 4 and of the single phase meter 5, wherein the polyphase meter 4 and single phase meter 5 mates with the socket type housing base 2 in FIGS. 1, 3 and 5, and the base 8 in FIGS. 2, 4, 6 and 7. In both cases, the meters 4, 5 are provided with rims which form an annular surface all around, and once the base 2 of the polyphase meter 4 and the base 8 of the single phase meter 5, respectively, have mated to the socket type base, the formed rims are capable of receiving the double fluke security sealing ring 3 in FIGS. 1, 3 and 5, and the double fluke sealing ring 6 in FIGS. 2, 4, 6 and 7. The electric power supplier company servicing input is shown as reference number 1 in FIGS. 1,3 and 5; and as reference number 7 in FIGS. 2 and 4.

In the isometric projection of FIG. 7, a ring 9 having the single-phase meter 5 cover assembled can be observed.

FIG. 8 is a side view of the parts of the security sealing ring 3, 6, such as the two flanges projection at 90°, which form an end of the security sealing ring body, and which form the double fluke 10. In this same figure, the other end of the security sealing ring can be appreciated, which comprises two parallel and equidistant slots 11 through which the two flanges in the double fluke 10 are introduced upon assembling the watt-hour meter and the socket type base. Each of the flanges of the double fluke 10 presents a central horizontal slot so that when the security sealing ring may be closed and activated, a sealing wire (not shown), which has inserted therein a lead or plastic seal, may serve to indicate that the security sealing ring was installed by the electric power supplier company serviceman.

FIG. 9 shows the security sealing ring opened, and the two ends can be appreciated Reference number 11 corresponds to the sealing ring end including the two slots where the two flanges of the double fluke 10 at the opposite end of the device of present invention will be inserted. Each flange of the double fluke 10 is bent 90°, and has a central horizontal slot, through which the sealing wire (not shown) is inserted, thereby allowing to determine whether the double fluke security sealing ring has been violated or remains intact.

When placing and closing the double fluke security sealing ring shown in FIG. 10, the complete detail of the locking mechanism can be observed, wherein the end of the double fluke 10 bears against the two flanges bent at 900, so as to interact with the two parallel and equidistant slots 11 that are located at the other end of the security sealing ring. When activating the lock, a hooking action and effect is generated. The locking mechanism of each element on each end forms a 15° angle at each slotted flange.

Once the hooking action and effect are generated between the double fluke 10 and the opposite end bearing the two slots 11, and once the sealing wire has been placed, it is possible to reverse such action by simply eliminating the sealing wire, thereby the present invention can be unhooked or opened in order to perform the necessary maintenance service on the watt-hour meter. Once this service is concluded, the procedure is repeated in order to install the same double fluke security sealing ring to secure the system with a new sealing wire, which identifies that the security sealing ring has not been violated or altered. The above mentioned procedure offers the great advantage of reducing costs to the electric power supplier company because only the sealing wire is replaced, but not the security sealing ring itself.

FIG. 11 is a sectioned view of FIG. 10 and shows the assemblage of the two ends of the security sealing ring, i.e. the double fluke 10 and the opposite end containing two slots 11.

What is claimed is:

1. A double fluke security sealing ring for watt-hour meters, comprising:
   a ring-shaped annular band for mounting to a base of a watt-hour meter, one end of the annular band including a double fluke comprising two slotted flanges positioned at 90° with respect to each other and aligned substantially parallel to a longitudinal axis of the annular band, the other end of the annular band including two parallel and equidistant slots capable of receiving the double fluke to lock the annular band in place.

2. The double fluke security sealing ring according to claim 1, wherein the double fluke formed by the two slotted flanges is integrally formed with the annular band.

3. The double fluke security sealing ring according to claim 1, wherein the two equidistant slots are integrally formed with the annular band.

4. A double fluke security sealing ring for watt-hour meters, comprising:
   a ring-shaped annular band for mounting to a base of a watt-hour meter and having a first end and a second end;
   a locking mechanism including a double fluke comprising two slotted flanges positioned at 90° with respect to each other and aligned substantially parallel to a longitudinal axis of the annular band at the first end of the annular band and two parallel and equidistant slots at the second end of the annular band capable of receiving the double fluke to lock the annular band in place.

5. The double fluke security sealing ring according to claim 4, wherein the locking mechanism is integrally formed with the annular band.

6. The double fluke security sealing ring according to claim 4, wherein the locking mechanism forms a 15° angle at each slotted flange.

* * * * *